United States Patent
Peng et al.

(10) Patent No.: US 8,872,599 B2
(45) Date of Patent: Oct. 28, 2014

(54) POWER SYNTHESIS CIRCUIT FOR RADIO FREQUENCY POWER AMPLIFIER

(75) Inventors: Fengxiong Peng, Guangdong (CN); Xuguang Zhang, Guangdong (CN)

(73) Assignee: ZYW Microelectronics, Inc, Huizhou (CN)

( * ) Notice: Subject to any disclaimer, the term of this patent is extended or adjusted under 35 U.S.C. 154(b) by 297 days.

(21) Appl. No.: 13/498,910

(22) PCT Filed: Dec. 16, 2010

(86) PCT No.: PCT/CN2010/079893
§ 371 (c)(1),
(2), (4) Date: Mar. 28, 2012

(87) PCT Pub. No.: WO2012/024874
PCT Pub. Date: Mar. 1, 2012

(65) Prior Publication Data
US 2012/0182084 A1    Jul. 19, 2012

(30) Foreign Application Priority Data

Aug. 24, 2010   (CN) .......................... 2010 1 0262926

(51) Int. Cl.
*H03H 7/38* (2006.01)
*H03F 3/24* (2006.01)
*H03F 1/52* (2006.01)
*H03F 3/68* (2006.01)
*H03F 1/56* (2006.01)

(52) U.S. Cl.
CPC ............ *H03F 3/24* (2013.01); *H03F 2200/111* (2013.01); *H03F 2200/451* (2013.01); *H03H 2007/386* (2013.01); *H03F 1/52* (2013.01); *H03F 2200/387* (2013.01); *H03F 3/68* (2013.01); *H03F 1/565* (2013.01)
USPC ........................... 333/124; 333/129; 333/132

(58) Field of Classification Search
USPC ......................................... 333/124–129, 132
See application file for complete search history.

(56) References Cited

U.S. PATENT DOCUMENTS

| | | |
|---|---|---|
| 7,756,486 B1 | 7/2010 | Tan et al. |
| 2006/0033573 A1 | 2/2006 | Yano et al. |
| 2007/0126526 A1 | 6/2007 | Ataka et al. |

FOREIGN PATENT DOCUMENTS

CN   101667854 A   3/2010

OTHER PUBLICATIONS

EPO Search Report, App. No. EP 10 85 6326.

*Primary Examiner* — Robert Pascal
*Assistant Examiner* — Kimberly Glenn
(74) *Attorney, Agent, or Firm* — Hemisphere Law, PLLC

(57) ABSTRACT

A power synthesis circuit for a radio frequency (RF) power amplifier comprises a first matching network and a second matching network, which are connected with two-band signal output ports of the RF power amplifier respectively, and signal coupling circuits which are connected with two-band signal receiving ports respectively. The first matching network and the second matching network are connected with an antenna circuit via a duplexer, and are grounded via an inductor and a switch element which is connected in parallel to the inductor respectively. The leakage of signal among different channels is prevented. The transmission quality of the RF signal is improved. The cost of the power amplifier is reduced and the structure of the power amplifier is simplified.

9 Claims, 4 Drawing Sheets

POWER SYNTHESIS CIRCUIT FOR RADIO FREQUENCY POWER AMPLIFIER

BACKGROUND OF THE INVENTION

The present invention relates to the field of RF power amplifier technology, specifically to the power combining method and the power-combiner circuit for a RF power amplifier.

The RF power amplifier (PA) is an important part of the wireless communication system. PA, used for the final stage of the transmitter, amplifies the modulated band signal to the required power value and passes it to the antenna for transmission. A communication system often works in multiple frequency bands, which requires a system of multi-channel switches to realize independent working of different bands. However, there is usually only one antenna equipped on the handheld device for the sake of smaller volume and increased portability, so the RF power amplifier power combiner circuit shall control between the RF power amplifier and the antenna. Therefore, the performance of RF power amplifier power-combiner circuit in such things as power capacity, insertion loss, isolation, and anti-voltage breakdown ability will greatly affect the performance of the entire wireless communication system. And these performance indicators also impose tough requirements on the RF power amplifier power combiner circuit components such as switches and duplexers. To meet the high requirements of the RF power amplifier, expensive GaAs technology is adopted for the design of most power-combiner circuit switches, the disadvantages of which include not only complicated circuit design, but also high cost, low integration and immature process compared to common CMOS technology.

At present, traditional power-combiner circuits for RF power amplifiers are generally as shown in FIG. 1. The overall circuit includes switches SW1, SW2, matching network, matching network D, the RX receiver port, duplexers, antennas and the ESD circuit on the antenna side. As the bridge between the RF power amplifier and antenna, switches SW1 and SW2 should have a high breakdown voltage, and can withstand the high-power signal launched by the RF power amplifier to prevent collapse of the entire communication system caused by switch damage. And for the whole RF power amplifier power combiner circuit, its isolation degree will also affect the overall system performance. As shown in FIG. 1, when Band1 channel of the PA transmits power, the PA output power is transmitted to the antenna through switch SW1 and the duplexer. Since switch SW1 must bear all of the PA transmit power, it must have a high breakdown voltage and over-power capability, which means only expensive GaAs technology with high breakdown voltage is available to make the switch, and the insertion loss of the switch cascaded in the emission path will directly impact the power of the antenna side; when RX side receives power, the signals at the antenna end reach the receiver through the duplexer and SW5-SW8, and the receiver insertion loss of switch SW5-SW8 cascaded in the receiving path will directly affect receiver sensitivity of the entire communication system. In summary, the RF power amplifier power-combiner circuit and its switches and key components require very high over-power capability, very low insertion loss to reduce the output RF signal attenuation. And high isolation degree of the combiner circuit is also required to reduce signal leakage between power channels. Traditional switches in the RF power amplifier power-combiner circuit are mostly designed with PHEMT tubes using expensive GaAs technology to meet the requirements of low insertion loss, high isolation degree, high over-power capability and high breakdown voltage. However, the PHEMT tube is a depletion-mode FET, and drives the gate with negative voltage, which increases design complexity and the cost of design and production of the switch control circuit. While designing switches with the CMOS technology has the advantages of high integration, technical maturity and low cost, it also has the disadvantes of low breakdown voltage, and a limited switch isolation degree. Thus, it is crucial to design a low-cost, high-performance RF power combiner network from the view of overall network of the RF power amplifier power combiner circuit and in combination with the advantages of CMOS technology.

BRIEF SUMMARY OF THE INVENTION

The present invention aims at solving the problems of low integration, high cost and the complexity of the RF switch control circuit in traditional RF power amplifier combiner circuits using GaAs technology switches, thereby providing a novel RF power combining method and its combiner circuit with a CMOS technology switch.

To solve the above problems, the technical solution of the present invention is as follows: to provide an RF power amplifier power-combiner circuit, which is connected to the antenna, including the first matching network and second matching network connected respectively to the two-band signal output ports of the RF power amplifier, and the signal coupling circuit connected respectively to the two-band signal receiver ports. The first matching network and second matching network are connected to the antenna circuit through the duplexer. It is characterized in that the first matching network is grounded through the inductor and the switching elements in parallel with the inductor, and the second matching network is grounded through the inductor and the switching elements in parallel with the inductor.

Preferably, the signal transmission line between the first matching network and the signal coupling circuit is grounded through the inductor and the switching elements connected in parallel with the inductor; the signal transmission line between the second matching network and the signal coupling circuit is grounded through the inductor and the switching elements connected in parallel with the inductor.

More preferably, the first matching network includes the cascaded front-end matching network and secondary matching network, and the second matching network also includes the front-end matching network and secondary matching network; the two front-end matching networks are connected to the grounded switching elements and the inductor, and the two secondary matching networks are connected with the duplexer.

Specifically, the signal coupling circuit uses the coupling capacitance; switching elements are cascaded with the coupling capacitance and the band signal receiver port; or, the signal transmission line between the coupling capacitance and the band signal receiver port is grounded through the switching elements.

The switching elements of the circuit in this invention can all be realized with common CMOS technology. Considering the relatively low breakdown voltage of CMOS technology switches, reasonable measures have been taken to improve the CMOS switch connection in the power combination network so as to reduce the voltage swing on the CMOS switches as much as possible in order to increase the reliability of the whole radio frequency combiner network; and by flexibly controlling the connection and disconnection of the switches in the whole power combination network, the combination of matching networks under different working patterns is realized and signal leakage between different channels is avoided, thus the transmitting quality of the radio frequency signal is guaranteed and the performance of the whole wireless communication system is effectively strengthened.

Compared with the RF power amplifier power combiner circuit with a PHEMT switch currently made with expensive GaAs technology, the present invention also has the advantages of high integration, low cost, and a simple switch control circuit.

DETAILED DESCRIPTION OF THE INVENTION

Further description of the present invention is given in combination with the drawings and embodiments to facilitate understanding by those skilled in this art.

Figure 1:
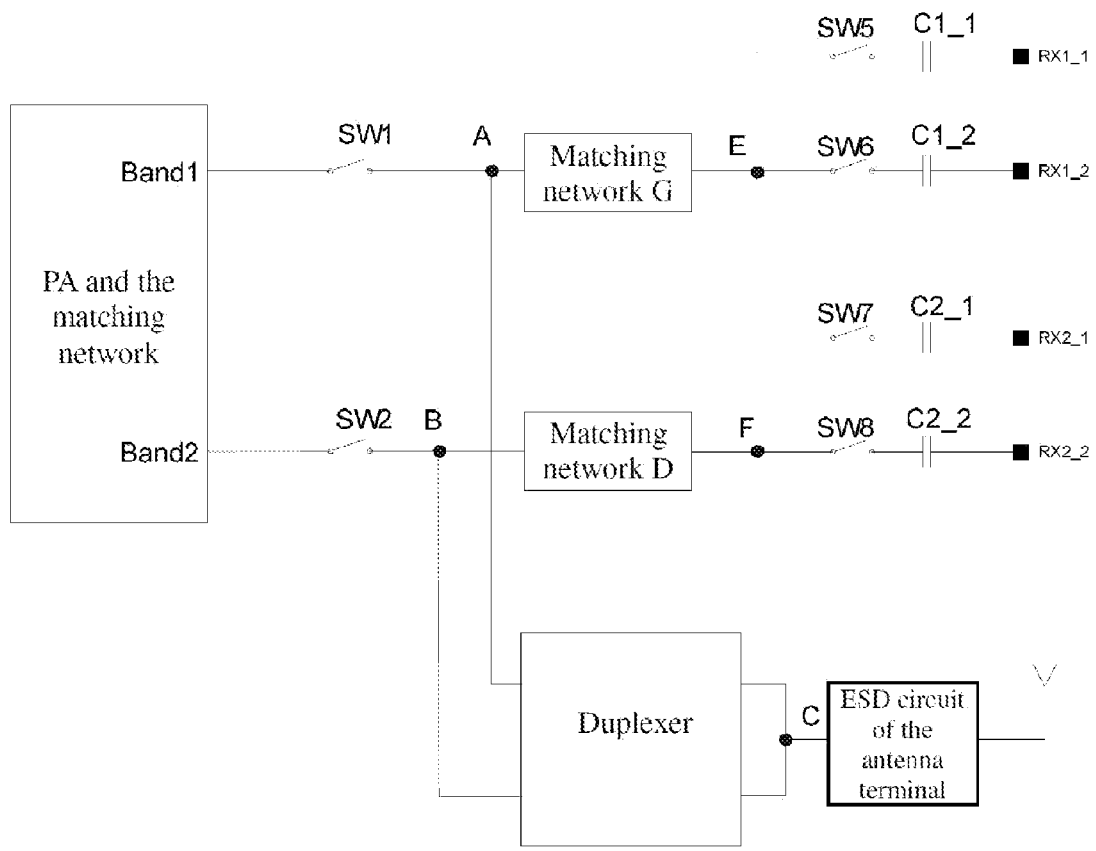
FIG. 1 is the elementary diagram of traditional RF power amplifier power combiner circuit.
Figure 2:
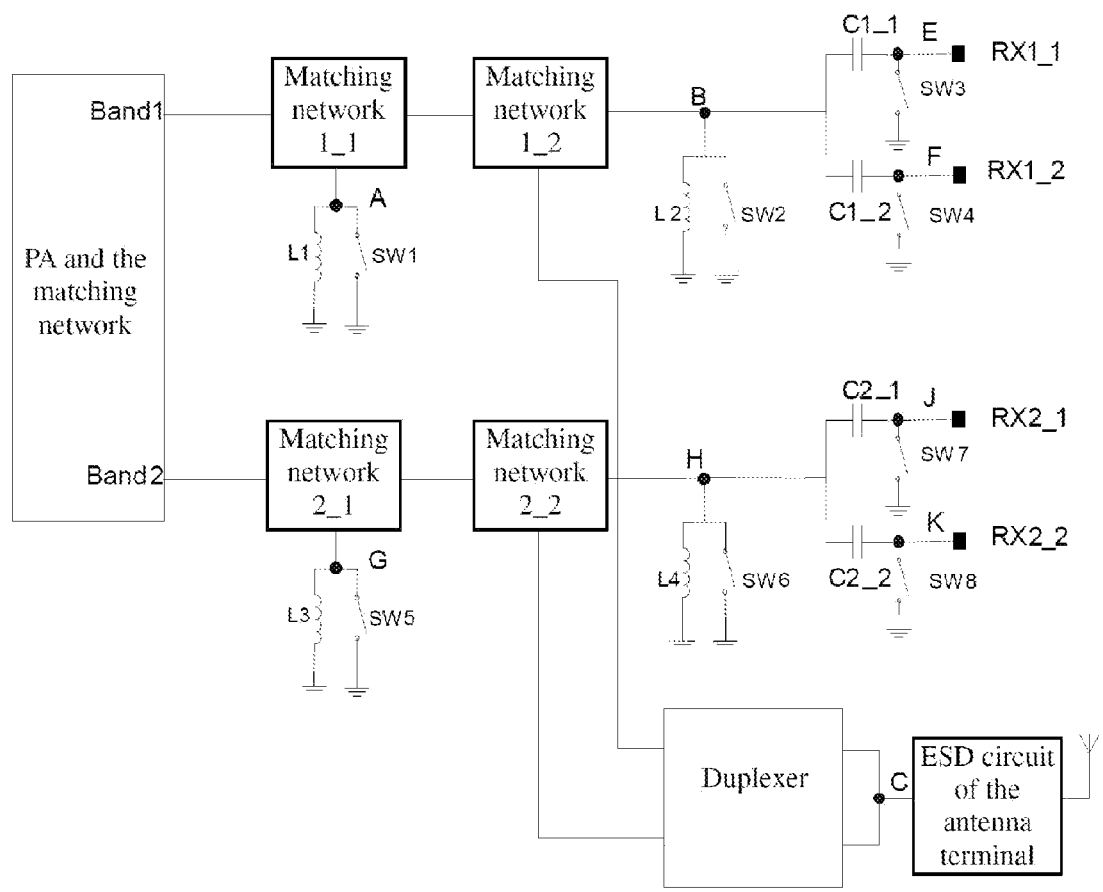
FIG. 2 is the first circuit embodiment of the RF power amplifier power combiner circuit in the present invention.

FIG. 2 shows the first embodiment of RF power combination of the circuit in the present invention with CMOS switches. All of the switches SW1, SW2, SW3, SW4, SW5, SW6, SW7, SW8 are grounded in parallel. Through signal switching by controlling the connection and disconnection of the switches and with the coordination of matching networks 1_1, 1_2, 2_1, 2_2, the voltage swing on the switch is greatly reduced, thus overcoming the defects of low breakdown voltage of the CMOS technology.

The working principle of the diagram is as follows: when Band1 channel transmits power, the switches SW1, SW2, SW3, SW4, SW6, SW7, SW8 are closed and grounded, and switch SW5 is disconnected. Meanwhile, Node A, node B and node H are directly connected to the ground through the switch, shielding their own parallel inductance. RF signal is transmitted to the duplexer and reaches node C through matching network 1_1 and matching network 1_2, while weak RF signal leaked by matching network 1_2 is absorbed by switches SW2, SW3, SW4 to avoid affecting the reception channel, thus effectively improving the isolation degree between the transmission and receiver channels. And the small amount of RF signals at node C leaked to node H through the duplexer will be conducted to the earth by the grounded switch SW6, without affecting the receiver channel RX2_1 RX2_2.

In particular, for the small amount of signals leaked from Band1 channel to Band2 transmission channel within the power amplifier PA, because of the disconnection of SW5, the resonant network formed by the matching network 2_1 and inductor L3 will inhibit the impact of the leaked signals on the receiver channel, effectively improving the isolation degree between the different channels.

When Band2 channel transmits power, the switches SW2, SW3, SW4, SW5, SW6, SW7, SW8 are closed and grounded, and switch SW1 is disconnected. Meanwhile, Node B, node G and node H are directly connected to the ground through the switch, shielding their own parallel inductance. The RF signal is transmitted to the duplexer and reaches node C through matching network 2_1 and matching network 2_2, while weak RF signal leaked by matching network 2_2 is absorbed by switches SW6, SW7, SW8 to avoid affecting the reception channel, thus effectively improving the isolation degree between the transmission and receiver channels. And the small amount of RF signals at node C leaked to node B through the duplexer will be conducted to the earth by the grounded switch SW2, without affecting the receiver channel RX.

Similarly, for the small amount of signals leaked from Band2 to Band1 transmission channel within the power amplifier PA, because of disconnection of SW1, the resonant network formed by the matching network 1_1 and inductor L1 will inhibit the impact of the leaked signals on RX channel, effectively improving the isolation degree between different channels.

When the antenna receivers Band1 signal and needs to transmit it to the receiver end RX1_1 port, switches SW1, SW2, SW3 are disconnected, switch SW4 is closed and is in conduction, and matching network 1_2, inductor L2 and capacitor C1_1 form a matching network in combination to realize receiving match and make the Band1 signal received by the antenna smoothly transmitted to RX1_1 port through the duplexer. Meanwhile, a resonant network is formed by the matching network 1_1 and inductor L1 and it will eliminate the impact of the Band1 channel of power amplifier PA on the receiving port RX1_1. Likewise, when the signal received by the antenna is transmitted to the receiver end RX1_2 port, switches SW1, SW2, SW3 are disconnected, switch SW4 is disconnected and switch SW3 is closed and is in conduction; the signal received by the antenna will be smoothly transmitted to RX1_2 port through the duplexer first and then matching network 1_2.

When the antenna receivers Band2 signal, and needs to transmit it to the receiver end RX2_1 port, switches SW5, SW6, SW7 are disconnected, switch SW8 is closed and is in conduction, and matching network 2_2, inductor L4 and capacitor C2_1 form a matching network in combination to realize receiving match and make the Band2 signal received by the antenna smoothly transmitted to RX2_1 port through the duplexer. Meanwhile, a resonant network is formed by the matching network 2_1 and inductor L3, and it will eliminate the impact of the Band2 channel of power amplifier PA on the receiving port RX2_1. Likewise, when the signal received by the antenna is transmitted to the receiver end RX2_2 port, switches SW5, SW6, SW7 are disconnected, switch SW8 is disconnected and switch SW7 is closed and is in conduction; the signal received by the antenna will be smoothly transmitted to RX2_2 port through the duplexer first and then the matching network.

In specific circuit implementation, the CMOS switches and the matching network 1_1, matching network 1_2, matching network 2_1, matching network 2_2 in this program can be correspondently altered according to the actual situation.

Figure 3:
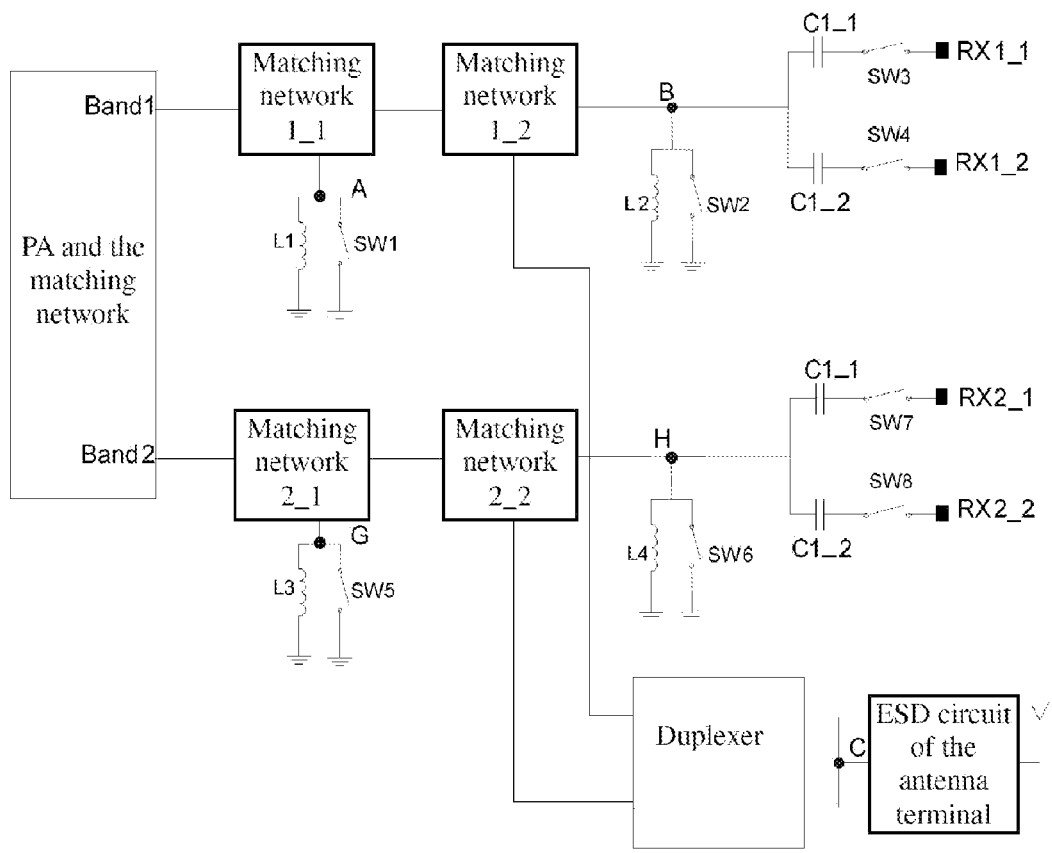
FIG. 3 is the second circuit embodiment of the RF power amplifier power combiner circuit in the present invention.

FIG. 3 is the diagram of the second preferred circuit embodiment in the present invention. The difference between this embodiment and the first embodiment is that the switches of the receiver end are cascaded, so the corresponding switch is connected when the channel receives signal, and disconnects at other times. Since the receiver signal is very weak when the RF power combiner network achieves signal reception, no breakdown will happen to the CMOS switches and the insertion loss can be reduced through proper design, thereby increasing the sensitivity of the receiving system.

Other description of the working principle of this embodiment is the same as that of the first embodiment, and grounded switches in parallel can be further increased in the receiver end, that is, cascading switching elements between the signal receiving end RX1_1 RX1_2, RX2_1, RX2_2 and coupling capacitance C1_1 C1_2 C2_1, C2_2 respectively, at the same time, the signal transmission line between each signal receiving end and the coupling capacitance is grounded through the switch elements so as to further improve the isolation degree between the transmitting and receiving channels.

Figure 4:
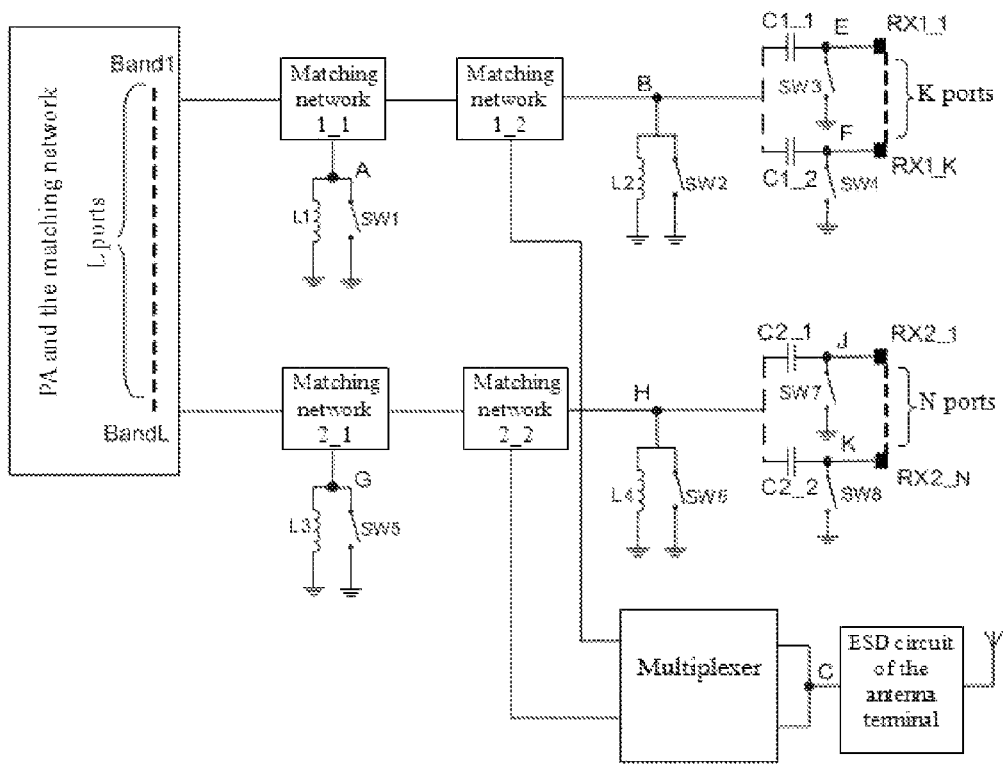
FIG. 4 is the third circuit embodiment of the RF power amplifier power combiner circuit in the present invention.

FIG. 4 is the diagram of the third preferred circuit embodiment in the present invention, an extension of the first embodiment. The difference between this embodiment and the first one is the increase of transmission ports and receiving ports, aiming at meeting the requirement of multi-frequency band transmission and reception. Detailed description of the working principle is the same with that of the first one.

The specific implementation of each matching network, resonant network of the present invention and the choice of amplifier shall be determined by those skilled in this art depending on the specific situation, so no detailed description is provided here.

Above are only preferred embodiments of the present invention. It shall be made clear that any slight change or equivalent replacement in the premise of the concept of the present invention shall belong to the protection scope of the present invention.

What is claimed is:

1. A power synthesis circuit for radio frequency power amplifier, which being connected to an antenna, comprising:
   a duplexer connected to the antenna;
   a first matching network and a second matching network respectively connected between signal output ports of a two band radio frequency power amplifier and the duplexer; and
   a plurality of signal coupling circuits connected to a plurality of two-band signal receiver ports respectively;
   wherein the first matching network is grounded through a first inductor and a first switching element connected in parallel with the first inductor, and the second matching network is grounded through a second inductor and a second switching element connected in parallel with the second inductor; a part of the plurality signal coupling circuits are connected to the first matching network via a first signal transmission line, and the other part of the plurality signal coupling circuits are connected to the second matching network via a second signal transmission line.

2. The power synthesis circuit as claimed in claim 1, wherein the first signal transmission line is grounded through a third inductor and a third switching element connected in parallel with the third inductor; the second signal transmission line is grounded through a fourth inductor and a fourth switching element connected in parallel with the fourth inductor.

3. The power synthesis circuit as claimed in claim 2, wherein said first matching network comprises a first front-end matching network (1-1) and a first secondary matching network (1-2) connected in series with the first front-end matching network, the second matching network comprises a second front-end matching network (2-1) and a second secondary matching network (2-2) connected in series with the second front-end matching network; the first and second front-end matching networks are grounded via the first and second switching elements and the first and second inductors, and the first and second secondary matching networks are connected with the duplexer.

4. A power synthesis circuit which is connected with an antenna, the power synthesis circuit comprising:
   a multiplexer connected to the antenna;
   a plurality of matching networks, each of which being connected between a band signal output port of an RF power amplifier and the multiplexer, and
   a plurality of signal coupling circuits, each of which being connected between a band signal receiver port and one of the plurality of matching networks;
   wherein the plurality of matching networks are grounded through a corresponding inductor and a corresponding switching element connected in parallel with the corresponding inductor.

5. The power synthesis circuit as claimed in claim 4, wherein each signal transmission line connected between one of the plurality of matching networks and a corresponding one of the plurality of signal coupling circuits is grounded through an inductor and a switching element connected in parallel with the inductor.

6. The power synthesis circuit as claimed in claim 5, wherein each one of the plurality of matching networks comprises a front-end matching network and a secondary matching network connected in series with the front-end matching network; the front-end matching network is grounded via a switching element and an inductor connected in parallel with the switching element, and the secondary network is connected with the duplexer.

7. The power synthesis circuit as claimed in claim 1 or claim 4, wherein each one of the plurality of signal coupling circuits is coupling capacitance.

8. The power synthesis circuit as claimed in claim 7, wherein each signal transmission line connected between the corresponding coupling capacitance and the corresponding band signal receiver port is grounded through a switching element.

9. The power synthesis circuit as claimed in claim 7, wherein there are switching elements cascaded with the coupling capacitance and the band signal receiver port.

* * * * *